United States Patent [19]

Kunoff et al.

[11] Patent Number: 5,488,615
[45] Date of Patent: Jan. 30, 1996

[54] UNIVERSAL DIGITAL SIGNATURE BIT DEVICE

[75] Inventors: Noah Kunoff, Old Bethpage; Anant Patel, Hicksville; Robert D. Melton, Commack, all of N.Y.

[73] Assignee: AIL Systems, Inc., Deer Park, N.Y.

[21] Appl. No.: 486,315

[22] Filed: Feb. 28, 1990

[51] Int. Cl.$^6$ .................................................. H04B 17/00
[52] U.S. Cl. ...................... 371/22.4; 371/15.1; 371/22.1
[58] Field of Search .................... 371/22.4, 21.3, 371/25.1, 20.4, 22.5, 22.1, 27, 15

[56] References Cited

U.S. PATENT DOCUMENTS

| | | | |
|---|---|---|---|
| 4,108,359 | 8/1978 | Proto | 371/22.4 |
| 4,357,703 | 11/1982 | Van Brunt | 371/22.5 |
| 4,527,272 | 7/1985 | Reiney | 371/22.4 |
| 4,534,030 | 8/1985 | Paez et al. | 371/22.4 |
| 4,551,838 | 11/1985 | Grannett | 371/22.4 |
| 4,701,920 | 10/1987 | Resnick et al. | 371/22.5 |
| 4,710,932 | 12/1987 | Hiroshi | 371/25.1 |
| 4,724,380 | 2/1988 | Burrows et al. | 371/22.4 |
| 4,764,926 | 8/1988 | Knight et al. | 371/22.3 |
| 4,847,839 | 7/1989 | Hudson, Jr. et al. | 371/22.4 |
| 4,864,570 | 9/1989 | Savaglio et al. | 371/22.4 |
| 4,872,168 | 10/1989 | Aadsen et al. | 371/22.4 |
| 4,903,266 | 2/1990 | Hack | 371/22.4 |
| 4,931,870 | 6/1990 | Den Hollander | 358/142 |
| 4,975,640 | 12/1990 | Lipp | 324/158 R |

OTHER PUBLICATIONS

"A VHSIC ETM-Bus-Compatible Test and Maintenance Interface" Arra, IEEE Feb. 1987 International Test Conference pp. 964-971.

"Concurrent Control of Multiple Bit Structures" Breuer et al, IEEE Apr. 1988 Internatinal Test Conference p. 432.

"A Test and Maintenance Controller for a Module Containing Testable Chips" by Breuer et al, IEEE Apr. 1988 International Test Conference.

"Checking out VLSI with Standard Test Gear" by Resnick, Electronics, May 26, 1986 pp. 33-35.

Primary Examiner—Robert W. Beausoliel, Jr
Assistant Examiner—Phung My Chung
Attorney, Agent, or Firm—Hoffmann & Baron

[57] ABSTRACT

A digital signature built-in-test (BIT) device for testing a digital circuit includes circuitry for compressing test data received from the digital circuit. The test data compressing circuitry may include one or more linear feedback shift registers (LFSR), which compresses the test data and supplies a signature data word corresponding to the test data compressed. Circuitry for enabling the test data compressing circuitry for a predetermined period of time is also included. The enabling circuitry provides an enabling signal to the test data compressing circuitry. The signature data word from the test data compressing circuitry is stored in a buffer memory circuit. Control data is received by the digital signature BIT device from a remote processor. The control data is received and processed by a control circuit, which circuit supplies control signals to the test data compressing circuitry, signature data word storing circuitry and the enabling circuitry.

7 Claims, 10 Drawing Sheets

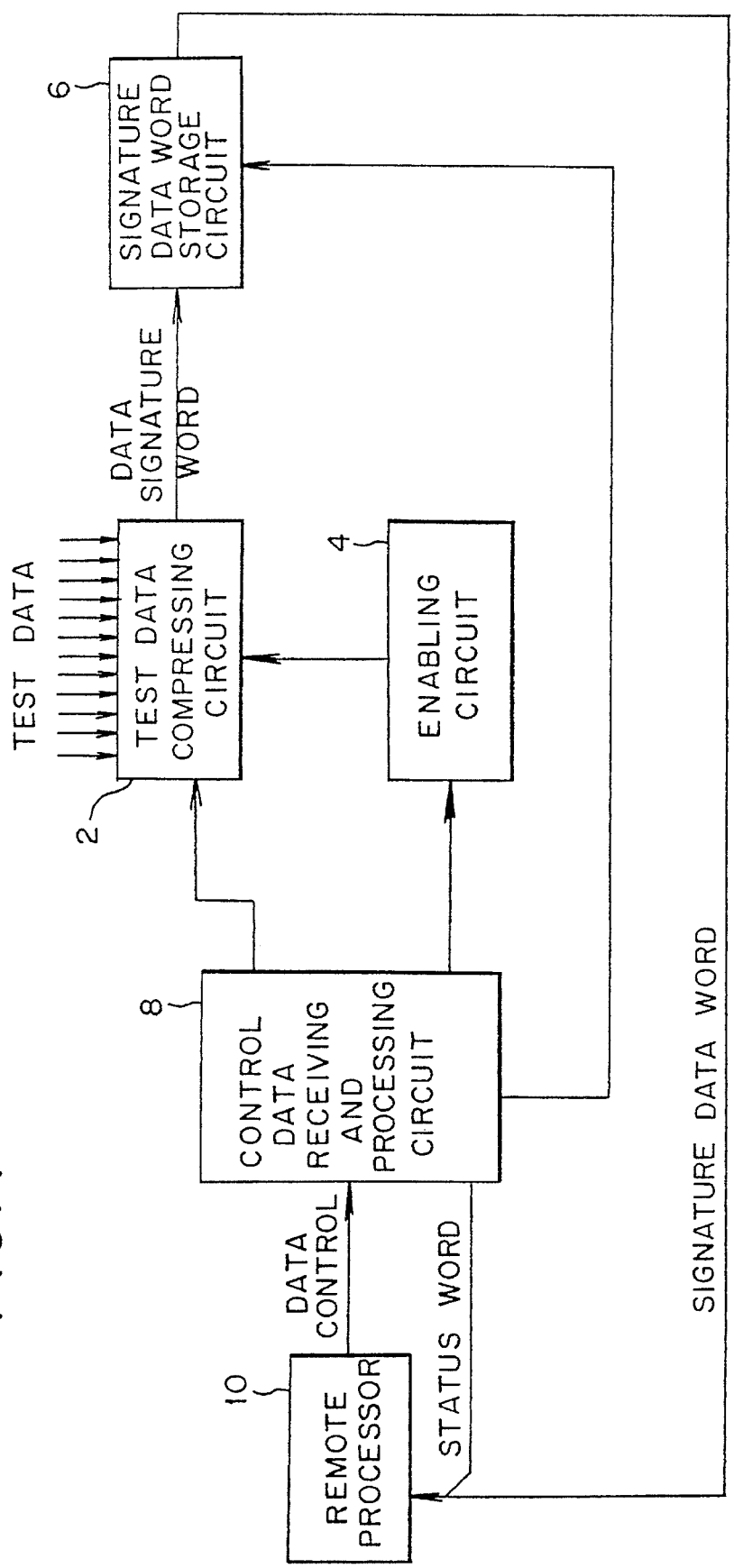

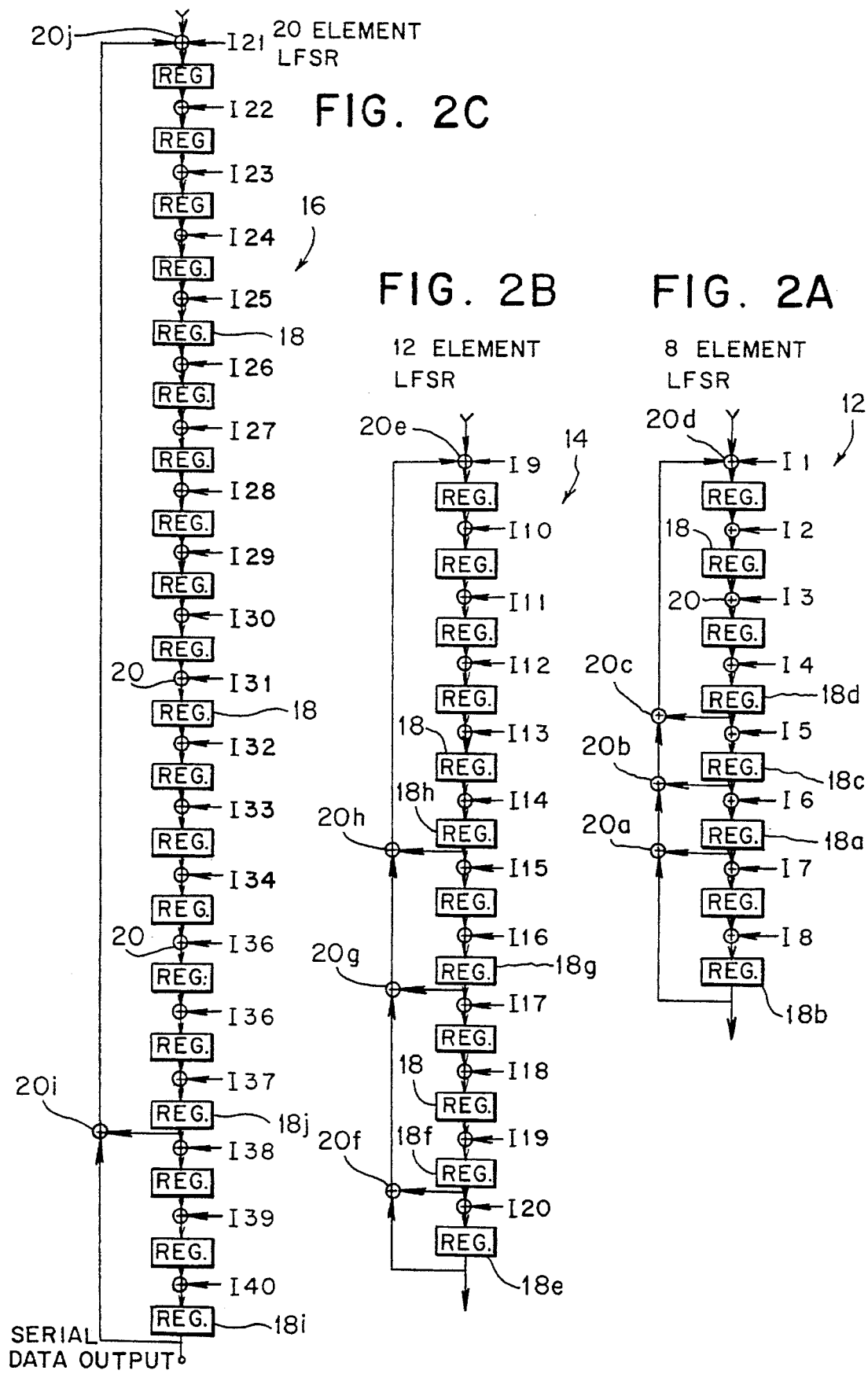

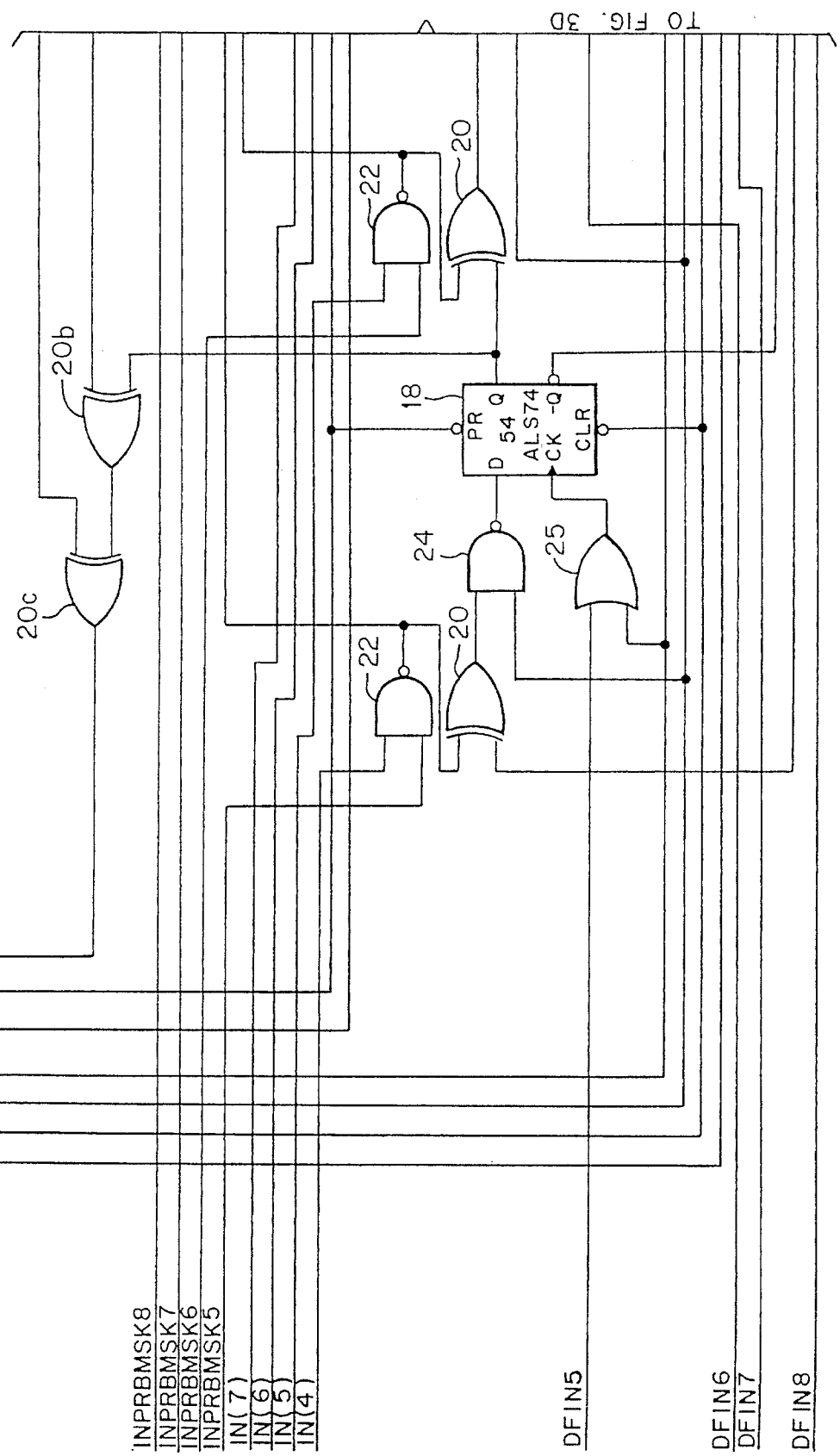

DSBD BLOCK DIAGRAM

FIG. 6     INPUT WORD FORMAT

| | 7 | 6 | 5 | 4 | 3 | 2 | 1 | 0 |
|---|---|---|---|---|---|---|---|---|
| DATA WORD 0 | PRB SEL 1 | PRB SEL 0 | MODE 2 | MODE 1 | MODE 0 | RD SIG | PRST | NOT USED |
| DATA WORD 1 | DLY SEL 1 | DLY SEL 0 | PRD SEL 1 | PRD SEL 0 | CLK SEL 1 | CLK SEL 0 | SDI | SEL 0 |
| DATA WORD 2 | 7 | 7 | 6 | 5 | 4 | START TEST PATTERN MASK 3 | 2 | 1 |
| DATA WORD 3 | 7 | 7 | 6 | 5 | START TEST PATTERN 4 | 3 | 2 | 1 |
| DATA WORD 4 | 8 | | | INPUT PROBE MASK | | | | 1 |
| DATA WORD 5 | 16 | | | INPUT PROBE MASK | | | | 9 |
| DATA WORD 6 | 24 | | | INPUT PROBE MASK | | | | 17 |
| DATA WORD 7 | 32 | | | INPUT PROBE MASK | | | | 25 |
| DATA WORD 8 | 40 | | | INPUT PROBE MASK | | | | 33 |

FIG. 7

| | 7 | 6 | 5 | 4 | 3 | 2 | 1 | 0 |
|---|---|---|---|---|---|---|---|---|
| | PRB SEL | | | MODE | | RD SIG | PRST | TEST CMPLT |
| STATUS WORD 0 | 1 | | 2 | | 0 | 2 | 1 | 0 |
| | DLY SEL | | PRD SEL | | CLK SEL | | SDI SEL | |
| STATUS WORD 1 | 1 | | 1 | 0 | 1 | 0 | 1 | 0 |
| STATUS WORD 2 | 8 | 7 | 6 | START TEST PATTERN | | 3 | 2 | 1 |
| STATUS WORD 3 | 8 | 7 | 6 | START TEST PATTERN | 4 | 3 | 2 | 1 |
| STATUS WORD 4 | 8 | | | INPUT PROBE MASK | | | | 1 |
| STATUS WORD 5 | 16 | | | INPUT PROBE MASK | | | | 9 |
| STATUS WORD 6 | 24 | | | INPUT PROBE MASK | | | | 17 |
| STATUS WORD 7 | 32 | | | INPUT PROBE MASK | | | | 25 |
| STATUS WORD 8 | 40 | | | INPUT PROBE MASK | | | | 33 |
| STATUS WORD 9 | 8 | | | SIGNATURE | | | | 1 |
| STATUS WORD 10 | 16 | | | SIGNATURE | | | | 9 |
| STATUS WORD 11 | 24 | | | SIGNATURE | | | | 17 |
| STATUS WORD 12 | 32 | | | SIGNATURE | | | | 25 |
| STATUS WORD 13 | 40 | | | SIGNATURE | | | | 33 |

UNIVERSAL DIGITAL SIGNATURE BIT DEVICE

BACKGROUND OF THE INVENTION

1. Field of the Invention

The invention relates to fault detecting circuits, and more specifically relates to a circuit for detecting faults or failures in a circuit board with a high level of competence. Even more particularly, the invention relates to a universal built-in-test (BIT) monitoring circuit using signature analysis.

2. Description of the Prior Art

Built-in-test (BIT) circuits are well known in the art. A BIT device is generally an electronic circuit, used in conjunction with a host computer or on-board processor, which will help fault isolate a digital circuit.

In many conventional BIT devices, the processor generally plays a major role in controlling the operation of the BIT device. The BIT device receives a relatively large amount of operation and control data from the processor, and is highly dependent on the processor to run its test procedure. There is, in effect, significant software involvement in carrying out a BIT operation.

Many conventional BIT devices are functionally limited. For example, in some applications, the BIT device is limited to testing whether the digital circuit is receiving data properly from the processor. The BIT device reads the data, and provides that same data back to the processor to verify that the data is being received properly. Such conventional BIT devices only test the receiver/transmitter interface portion of the digital circuit or the data bus between the digital circuit and the processor.

Most conventional BIT devices are designed to operate on only one specific digital circuit, and cannot be programmed to test a variety of digital circuits.

OBJECTS AND SUMMARY OF THE INVENTION

It is an object of the present invention to provide a BIT monitoring device using signature analysis.

It is another object of the present invention to provide a digital signature BIT device which is essentially self-sufficient in its operation.

It is a further object of the present invention to provide a digital signature BIT device which is universal in the sense that it can test a variety of digital circuits.

It is still another object of the present invention to provide a digital signature BIT device which can be remotely programmed to operate in a plurality of test modes.

It is yet a further object of the present invention to provide a digital signature BIT device having an architecture which is economical with respect to circuit board space it occupies.

It is still another object of the present invention to provide a digital signature BIT device which minimizes the need for software involvement.

It is yet a further object of the present invention to provide a digital signature BIT device which overcomes the disadvantages of known test devices.

In accordance with one form of the present invention, a digital signature BIT device for testing a digital circuit includes circuitry for compressing test data received from the digital circuit being tested. The test data compressing circuit may be in the form of a multiple input linear feedback shift register (LFSR). The test data compressing circuit provides a signature data word corresponding to the test data which is compressed.

The digital signature BIT device of the present invention further includes circuitry for enabling the test data compressing circuit for a predetermined period of time. The enabling circuitry provides an enable signal to the test data compressing circuitry.

Also included is circuitry for storing the signature data word from the test data compressing circuitry.

In addition, circuitry for receiving and processing control data from a remote processor is included. The control data receiving and processing circuitry provides control signals to the test data compressing circuitry, the signature data word storing circuitry and the enabling circuitry.

Even more specifically, the test data compressing circuitry may include a first linear feedback shift register (LFSR), a second LFSR electrically coupled in series to the first LFSR, and a third LFSR electrically coupled in series to the second LFSR. Each of the first, second and third LFSRs have a plurality of test data inputs which are electrically coupled to the digital test circuit and on which are provided the test data.

Furthermore, each of the first, second and third LFSRs includes a plurality of serially interconnected stages, each of the test data inputs of a respective LFSR being coupled to a respective one of the stages. The first LFSR includes fewer stages than the second LFSR, and the second LFSR includes fewer stages than the third LFSR.

These and other objects, features and advantages of this invention will be apparent from the following detailed description of illustrative embodiments thereof, which is to be read in connection with the accompanying drawings.

BRIEF DESCRIPTION OF THE DRAWINGS

FIG. 1 is a basic block diagram of a digital signature BIT device formed in accordance with the present invention.

FIGS. 2A–2C are more detailed block diagrams of a portion of the BIT device shown in FIG. 1.

FIG. 6 is a diagram, in chart form, showing the format of the control data provided to the BIT device of the present invention.

FIG. 7 is a diagram, in chart form, showing the format of the test status and signature data word outputted by the BIT device.

DETAILED DESCRIPTION OF THE PREFERRED EMBODIMENTS

Figure 3A:
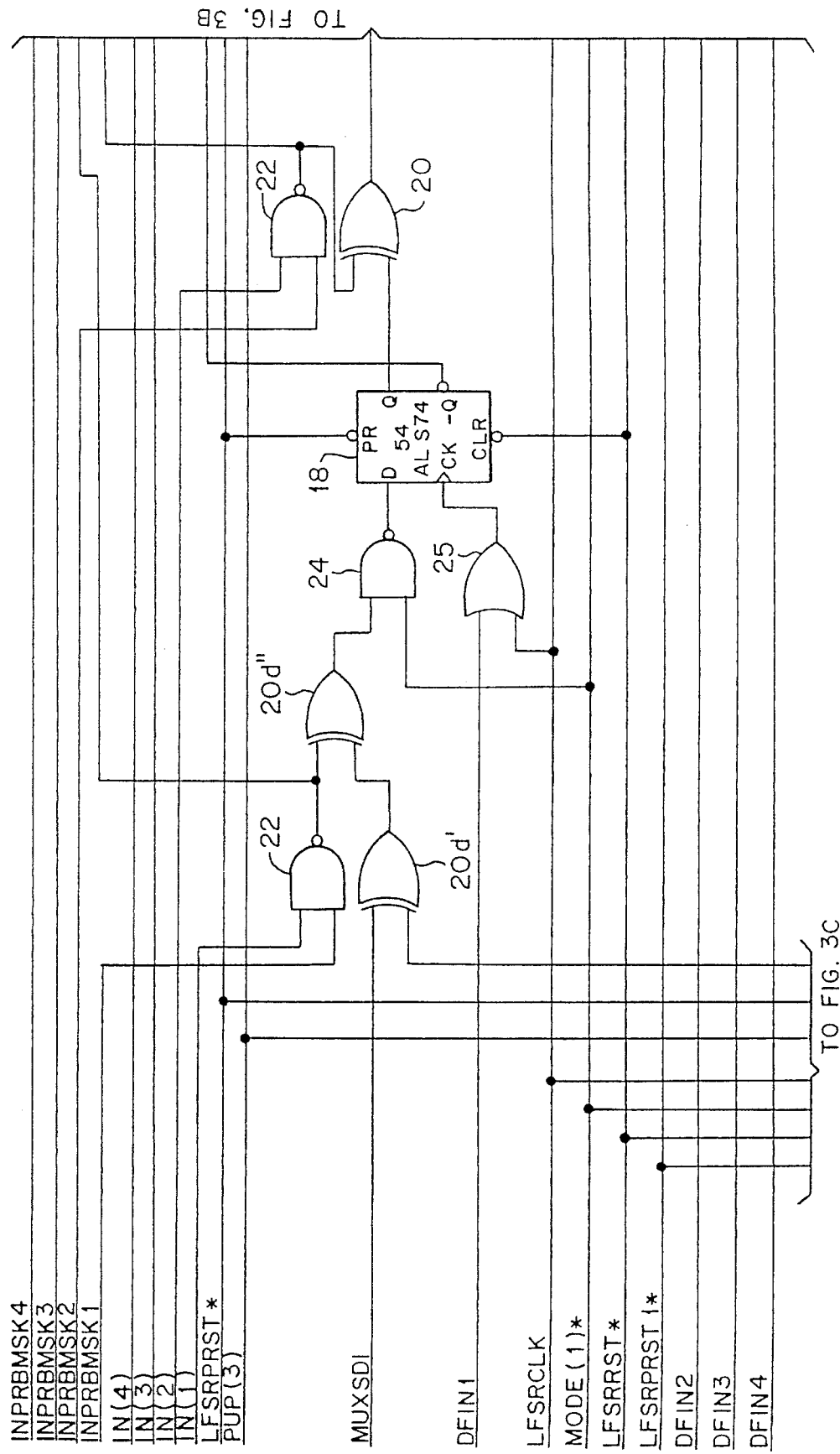
FIGS. 3(A–D) are schematic diagrams of a portion of the BIT device shown in FIG. 2.

FIG. 1 illustrates, in block diagram form, one form of a digital signature built-in-test (BIT) device constructed in accordance with the present invention. In its most basic form, as shown in FIG. 1, the digital signature BIT device includes circuitry 2 for compressing test data received from the digital circuit being tested. The test data compressing circuitry 2 provides a signature data word corresponding to the test data which is compressed.

The digital signature BIT device of the present invention further includes circuitry 4 for enabling the test data compressing circuitry 2 for a predetermined period of time. The enabling circuitry 4 provides an enable signal to the test data compressing circuitry 2.

The digital signature BIT device also includes circuitry 6 for storing the signature data word from the test data compressing circuitry 2, and circuitry 8 for receiving and processing control data from a remote processor 10. The control data receiving and processing circuitry 8 provides control signals to the test data compressing circuitry 2, the signature data word storing circuitry 6 and the enabling circuitry 4.

Generally, in designing BIT devices, it must be remembered that system fault isolation is limited by the complexity of digital fault detection. The BIT design may be governed by certain standards which require that the BIT device detect failure and out-of-tolerance modes which represent at least 98% of all electronic faults, and that the system design growth due to BIT circuitry and devices shall not exceed 10% of the system circuitry, parts and devices. The BIT device of the present invention is designed in accordance with this criteria and, furthermore, can test a variety of digital circuits.

A useful way to manage the large amount of data and operating speeds that are often required for testing digital systems is to compress test result data using simple compression algorithms. For this reason, the digital signature BIT device of the present invention incorporates circuitry 2 for compressing the test data received from the digital circuit.

A BIT device should also be designed so that test data can be repeated, beginning with a "start" signal and ending with a timed interval "stop" signal. Accordingly, the digital signature BIT device of the present invention includes circuitry 4 for enabling the test data compressing circuitry 2 for a predetermined period of time. The circuit under test is to have test stimulus chosen which will result in repeatable test data. Monitoring key lines using probes and compressing the data stream detected during the test then becomes achievable in the BIT device. The compressed result can be compared with the one that is known to be correct to determine whether a fault is present in the system.

As mentioned previously, the digital signature BIT device of the present invention preferably employs one or more linear feedback shift registers (LFSR) in the data compressing circuit 2 to compress the test data. With the LFSR in an initial known state, input test data is shifted into the register. This compresses the stream of input test data to the length of the LFSR and forms what is referred to as a "signature".

The theory of the occupancy of an LFSR used for signature analysis predicts that the probability of a single BIT error going undetected is equal to:

$$P_E = \frac{2^{m-n} - 1}{2^m - 1} \qquad \text{Eq. 1}$$

Where m equals the number of shifts in the data collection sequence, and n equals the number of flip flop stages in the LFSR.

For example, if the test sequence length (m) is limited so that it is equal to or greater than 256, and the digital signature BIT device is configured to have a signature analyzer length (n) equal to or greater than 12, then:

$$P_E = \frac{2^{256-12} - 1}{2^{256} - 1} \qquad \text{Eq. 2}$$

or $$P_E = \frac{2^{244} - 1}{2^{256} - 1} = 0.00024 \qquad \text{Eq. 3}$$

In the above example, the probability of not detecting a failure with the digital signature BIT device using an LFSR configured as stated above is less than 0.024% and, conversely, the probability of detecting any fault is 99.976%. Accordingly, the use of an LFSR is preferred in compressing the test data received from the digital circuit.

FIG. 2A–2C are block diagram of a preferred form of the test data compressing circuit 2. More specifically, the test data compressing circuit is formed of three linear feedback shift registers (LFSR) 12, 14, 16, each having a plurality of test data inputs (i.e., "probes") which are electrically coupled to the digital test circuit and on which are provided the test data. The second LFSR 14 is electrically coupled in series to the first LFSR 12, and the third LFSR 16 is electrically coupled in series to the second LFSR 14.

Each of the first, second and third LFSRs 12–16 includes a plurality of serially interconnected stages. Each of the test data inputs of a respective LFSR is coupled to a respective one of the stages. Preferably, the first LFSR 12 includes fewer stages than the second LFSR 14, and the second LFSR 14 includes fewer stages than the third LFSR 16.

As shown in FIG. 2, the first LFSR 12 is an eight element device. It includes a series of registers 18, and a series of exclusive OR gates 20. Adjacent registers 18 are interconnected through a common exclusive-OR gate 20.

More specifically, each of the exclusive OR gates 20 include two inputs and one output. One input is connected to the preceding register 18, while the other input is connected to a test data input (i.e., I1–I8) of the digital signature BIT device so that test data may be provided to each of the exclusive OR gates in the register chain of the LFSR.

In the eight element LFSR 12, the output signals of the sixth and eighth registers 18a, 18b are provided to the inputs of an exclusive OR gate 20a, whose output signal and that of the fifth register 18c are provided to the inputs of another exclusive OR gate 20b, similarly whose output signal and that of the fourth register 18d are provided to a third exclusive OR gate 20c. The output signal of the third exclusive OR gate 20c is provided to an input of a three input exclusive OR gate 20d which is situated in the beginning of the chain of registers 18 of the LFSR 12. Another input of the three input exclusive OR gate 20d is for serial data, as will be explained, and the last input of the three input exclusive OR gate 20d is connected to input I1 and is used for receiving test data.

The eight element LFSR 12 provides an 8-bit signature data word corresponding to the compressed test data provided to it. The output signal of the eighth register 18b of the eight element LFSR 12 is provided to the second LFSR 14, which is preferably a twelve element device.

More specifically, the eighth register of the eight element LFSR 12 is provided to one input of a three input exclusive OR gate 20e of the second LFSR 14. The second LFSR 14 is configured in the same manner as the first LFSR 12, that is, with a series of registers 18 interconnected through exclusive OR gates 20. Each of the exclusive OR gates has an input which is connected to the test data inputs (i.e., I9–I20) of the digital signature BIT device for receiving test data from the digital circuit being tested. The other input of each of the exclusive OR gates 20 in the chain of registers 18 of the second LFSR 14 is connected to the output of the preceding register.

In the second LFSR 14, the output signals of the twelfth and eleventh registers 18e, 18f are provided to the inputs of an exclusive OR gate 20f, whose output signal and that of the eighth register 18g are provided to the inputs of another exclusive OR gate 20g, similarly whose output signal and that of the sixth register 18h are provided to the inputs of a third exclusive OR gate 20h. The output signal of the third exclusive OR gate 20h is provided to one of the inputs of the three input exclusive OR gate 20e situated in the beginning of the twelve element LFSR 14. The other two inputs of the three input exclusive OR gate 20e are connected to a test data input I9 and the output of the eight element LFSR 12.

The twelve element LFSR 14 provides an output signal in the form of a 12 bit signature data word corresponding to the compressed test data provided to the twelve element LFSR 14 and to the eight element LFSR 12.

The third LFSR 16 is a twenty element device. Like the eight and twelve element LFSR 16, the twenty element LFSR 16 includes a series of registers 18 interconnected to one another through exclusive OR gates 20.

More specifically, each of the exclusive OR gates 20 have one input connected to the test data inputs (i.e., I21–I40) of the digital signature BIT device for receiving test data from the digital circuit being tested, and the other input connected to the preceding register stage. The outputs of the exclusive OR gates 20 are provided to the inputs of the next register stage in the chain of registers 18.

The output signals from the twentieth and seventeenth register 18i, 18j of the twenty element LFSR 16 are provided to an exclusive OR gate 20i, whose output signal is provided to one input of a three input exclusive OR gate 20j situated at the beginning of the twenty element LFSR 16. The other two inputs of the three input exclusive OR gate 20j are connected to the output of the twelfth register 18e of the second LFSR 14 and to a test data input I21 of the digital signature BIT device.

The output signal of the third LFSR 16 is a 20 bit signature data word which corresponds to the twenty inputted test data received by the third LFSR and compressed, the data outputted from the second LFSR 14 which is carried over serially to the third LFSR 16, and the data outputted by the first LFSR 12 which is carried over serially to the second LFSR and which passes to the third LFSR.

There are several advantages to having three LFSRs connected as shown in FIG. 2, each having a progressively greater number of stages. First, a "sectioned" LFSR circuit affords a higher degree of fault isolation in that, by looking at the signature data word of each LFSR 12–16, one can more easily determine which group of test data caused a fault condition.

Second, a sectioned LFSR provides a more rapid performance check of the digital circuit being tested. One just has to check the data from the last LFSR 16 (having the most significant bits of the signature data word) to get an overall picture of the circuit's performance.

Each of the registers in the first, second and third LFSR 12–16 is a single bit register, such as a D-type edge triggered flip flop, for example, an SN5474 integrated circuit. Each bit of the signature data word is provided by the Q or $\overline{Q}$ output of the flip flop. The clock inputs of the flip flops are interconnected and are connected to a system clock provided to the digital signature BIT device. Accordingly, the signature data word which is derived by the digital signature BIT device comprises 40 bits.

Figure 3B:
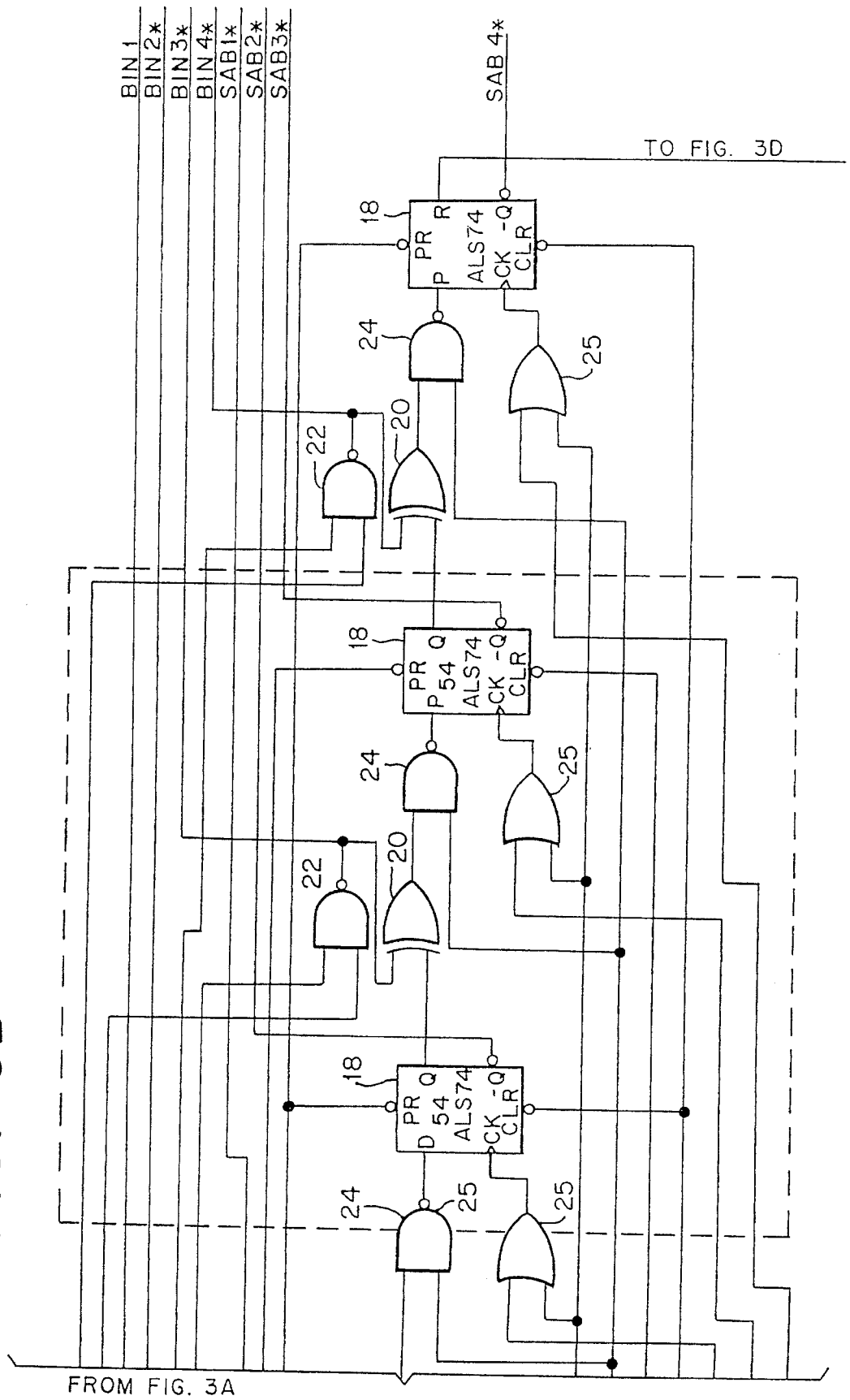
Figure 3D:
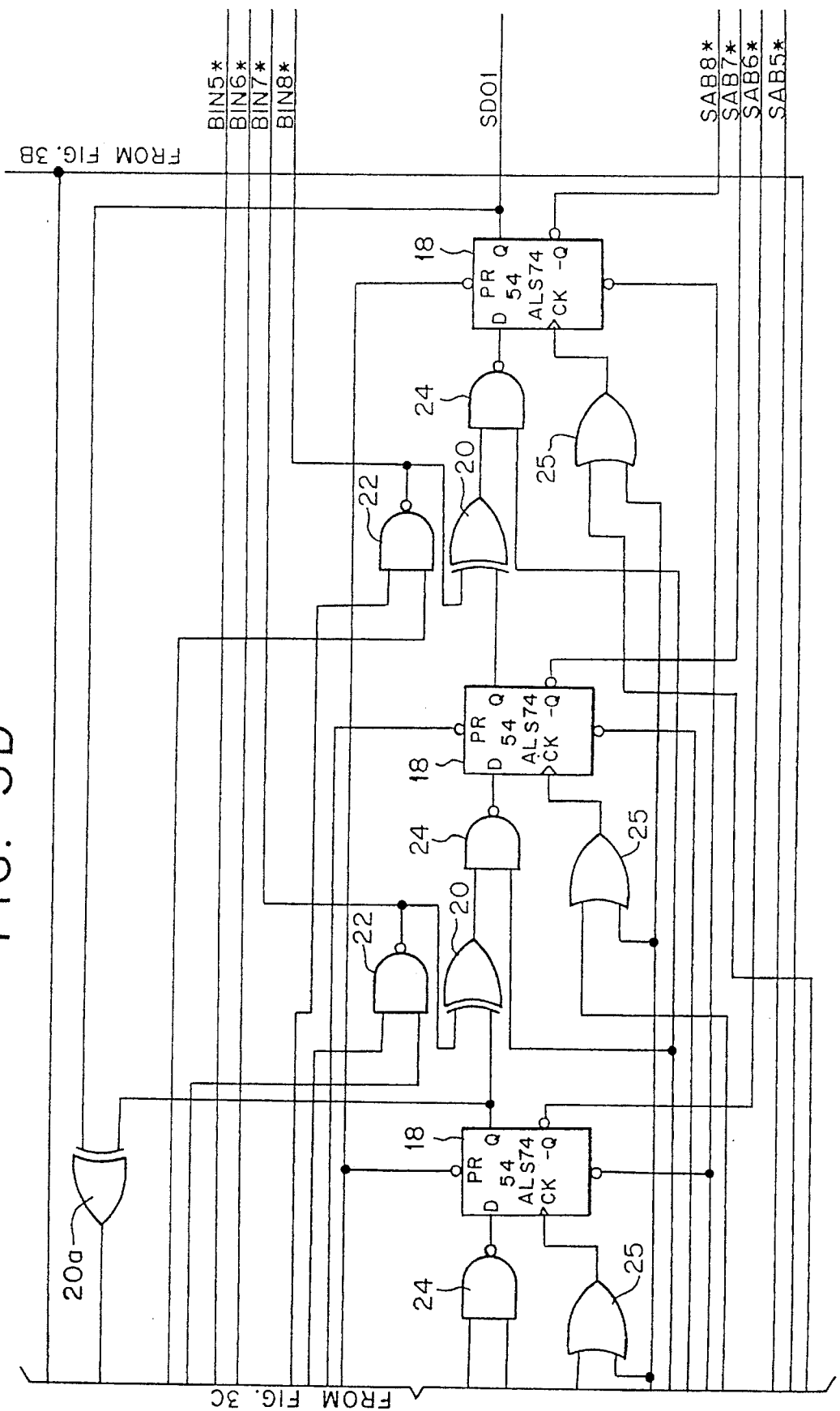

FIG. 3 illustrates schematically a preferred form of the 8 element LFSR 12, and shows, in particular, two successive stages (within the dashed lines) used in any one of the first, second and third LFSR 12–16. As mentioned previously, each register 18 may be a D-type edge triggered flip flop. With respect to one stage of the LFSR, test data provided to the digital signature BIT device is provided on one input of a NAND gate 22, whose other input is provided with a disable or "input probe mask" signal. The output of the NAND gate 22 is provided to one input of an exclusive OR gate 20, such as those shown in FIG. 2 situated between adjacent registers in the LFSRs. The output of the exclusive OR gate 20 is provided to an input of another NAND gate 24, whose other input is provided with a mode signal. The output of the NAND gate 24 is provided to the D input of the flip flop. The other input of the exclusive OR gate 20 is connected to the Q output of the previous flip flop in the chain. The NAND gates 22, 24 allow the LFSR to work in multiple modes. A logic 0 on the input probe mask signal will prevent input data from being clocked into the LFSR flip flops.

More specifically, the eight element LFSR 12 receives 8 input probe mask signals (INPRBMSK1-8) from the control data receiving and processing circuit 8. Individual test data inputs may be disabled by the input probe mask signals. The test data inputs (probes) are designated as IN(1) - IN(8) in FIG. 3, and are provided to NAND gates 22 of respective stages in the LFSR.

A first preset signal (LFSRPRST*) is provided to the preset inputs of a first group of flip flops in the LFSR, and a second preset signal (LFSRPRST1*) is provided to the clear inputs of a second group of LFSR flip flops, which also receives a pull-up signal (PUP(3)), which provides a logic 1, on their preset inputs. The first group of flip flops also receive a reset signal (LFSRRST*) on their clear inputs.

The purpose of the preset and reset signals is to set the LFSR to an arbitrary binary, non-zero value (i.e., at least one of the LFSR flip flops is set to a logic 1). If all of the flip flops in the LFSR are in a 0 logic state, no data will propagate through the LFSR.

A logic 0 on the mode signal (MODE(1)*) will effectively disable the D inputs on the LFSR flip flops. The mode signal, as well as the preset and reset signals, are all provided to the LFSR circuit by the control data receiving and processing circuit 8.

As will be explained in greater detail, the LFSR circuit is adapted to work in multiple modes. In one mode, it receives a clock signal (LFSRCLK). The clock signal is provided to one input of a plurality of OR gates 25, whose outputs are connected to the clock inputs of respective LFSR flip flops. In another mode, referred to as an "edge trigger" mode, the LFSR is designed to detect activity on the individual test data inputs (probes). In other words, any logic transition (i.e., from 0 to 1 or from 1 to 0) on an input test data probe will cause the flip flop corresponding to that input probe to receive a clock signal on its clock input.

To carry out edge detection, the output signals (BINi* - BIN8*) from the NAND gates 22 are provided to a logic differentiation circuit (not shown), which detects a transition in the test data and provides a relatively narrow pulsed, "differentiated" signal (DFIN1 - DFIN8) back to the LFSR. This differentiated signal is provided to corresponding second inputs of the OR gates 25, and will pass through the OR gates to trigger the flip flops.

The $\overline{Q}$ outputs of the flip flops provide the signature data (SAB1* - SAB8*), and the last flip flop in the chain provides a serial data output signal (SDO1) on its Q output to connect the 8 element LFSR 12 to the 12 element LFSR 14. As mentioned previously, serial data (MUXSDI) into the 8 element LFSR 12 is provided to a 3 input OR gate 20*d* comprising first and second input OR gates 20*d'*, 20*d"* coupled together.

Figure 4:
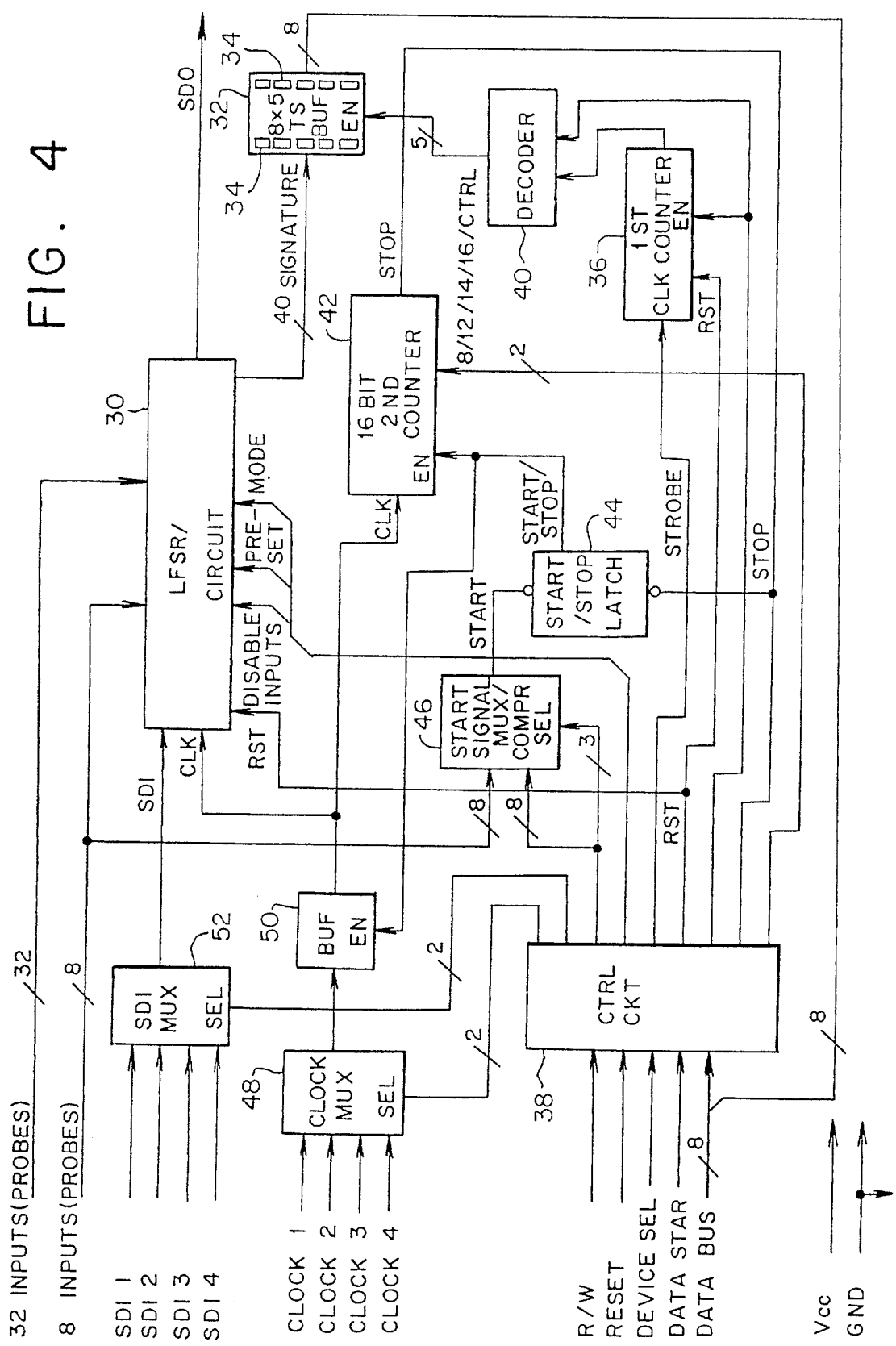
FIG. 4 is a more detailed block diagram of a digital signature BIT device formed in accordance with one form of the present invention.

FIG. 4 is more detailed block diagram of the digital signature BIT device constructed in accordance with one form of the present invention. The digital signature BIT device includes 40 inputs (i.e., probes) which are connected to the digital circuit being tested and which receive test data from the digital circuit. The 40 inputs are provided to the test data compressing circuit 2 including an LFSR circuit 30 comprising three LFSRs 12–16 serially interconnected, as described previously. The LFSR circuit 30 provides a 40 bit signature data word.

The signature data word storage circuitry 6, as shown in FIG. 1, preferably comprises a buffer memory circuit 32 which is electrically coupled to the LFSR circuit 30. More specifically, the buffer memory circuit includes a plurality of registers 34 which are connected to a 40 bit bus which carries the signature data word from the LFSR circuit 30. The signature data word is stored in these registers 34.

There are preferably five registers 34 having eight inputs each, so that all 40 bits of the signature data word may be stored in the registers. Each register 34 has eight outputs, and like outputs of each register are connected together. The registers have tri-state outputs so that when four registers are disabled and one register is enabled, the enabled register's portion (i.e., 8 bits) of the signature data word will be properly read out and will not be affected by the other registers of the buffer memory circuit 32. The outputs of the buffer memory circuit are provided on an 8 bit data bus to a host computer or remote processor 10.

The signature data word storage circuitry 6 further includes a first counter circuit 36 which is electrically coupled to the control data receiving and processing circuitry 8, shown in FIG. 4 as including a control circuit 38. The control circuit 38 provides a strobe signal to the clock input of the first counter circuit 36 as well as an enable signal. After being enabled by the enable signal, the first counter circuit 36 will count and provide count data in response to the strobe signal. More specifically, the counter will provide count data from a binary 0 to a binary 4, which are five count data words. This corresponds to the five registers 34 of the buffer memory circuit 32 which are storing portions of the 40 bit signature data word. A reset signal from the control circuit 38 will reset the counter 36 to a binary 0 again.

The signature data word storage circuitry 6 further includes a decoder circuit 40 electrically coupled to the first counter circuit 36 and to the buffer memory circuit 32. More specifically, the counter circuit 36 will provide count data to the decoder circuit 40, which will decode the count data and provide an enable signal on one of five lines connecting the decoder to each register 34 of the buffer memory circuit 32. Accordingly, in response to the count data from the first counter circuit 36, the decoder circuit 40 will provide an enable signal to one of the registers 34 such that a respective register of the buffer memory circuit will be enabled to allow signature data stored in the register to be read by the remote processor 10. The enable signal from the control circuit 38 is also provided to the decoder 40 to enable the decoder.

The enabling circuitry 4 shown in FIG. 1, which enables the test data compressing circuitry 2 for a predetermined period of time, preferably includes a second counter circuit 42 and a start/stop latch circuit 44, as shown in FIG. 4. The start/stop latch circuit 44 is electrically coupled to the second counter circuit 42 and provides a start/stop signal to the second counter circuit. The start/stop signal enables the second counter circuit 42 to count from a predetermined number (which may be programmed as zero or some other number), and will provide a terminal count or "stop" signal after counting a predetermined number of counts. The stop signal is provided to the start/stop latch circuit 44 and will disable or clear the start/stop latch circuit which, in turn, will disable the counter 42.

The second counter circuit 42 is preferably configured as a programmable 16 bit synchronous down counter. The counter circuit is operable over four test periods, in response to a 2 bit counter period signal provided to the counter 42 by the control circuit 38. One test period is when the counter 42 is programmed by the counter period signal to count using 8 of its 16 available bits. In such a case, a test period of 256 clocks is provided. A second test period is where the counter uses 12 bits, and the duration of the test period thus provided is 4096 clocks. The third test period is 16,384 clock periods in duration, using 14 of the counter's 16 bits, and the fourth test period has a duration of 65,536 clocks when all 16 bits of the counter are used.

The second clock circuit 42 includes a decoder circuit (not shown) which decodes the period select signal to determine which count is to be loaded into the counter. The counter circuit 42 receives the same clock signal as the LFSR circuit 30, and provides the stop signal not only to the start/stop latch circuit 44, but also to the control circuit 38 to let the control circuit know that the test period has ended.

The enabling circuitry 4 may also include a start signal multiplexer and comparator circuit 46. The start signal multiplexer and comparator circuit 46 is electrically coupled to the start/stop latch circuit 44 and to the control circuit 38. The control circuit provides an 8 bit start data to the start signal multiplexer and comparator circuit 46, which also receives test data from eight inputs of the forty inputs of the digital signature BIT device. The control circuit 38 also provides a select signal to the start signal multiplexer and comparator circuit 46.

The start signal multiplexer and comparator circuit 46 will select at least one of the 8 bits of test data it receives in response to the select signal from the control circuit 38, and it will compare the selected test data with one or more bits of the start data. When the selected test data and start data are equal, the start signal multiplexer and comparator circuit 46 will provide a start signal. The start/stop latch circuit is responsive to the start signal and, in turn, will provide the start/stop signal.

As mentioned previously, the LFSR circuit 30 and the second counter circuit 42 receives a clock signal whose period corresponds to the clock of the digital circuit being tested. In order to make the digital signature BIT device of the present invention more universally adapted to be connected with a variety of digital circuits, several clock signals CLOCK #1 - CLOCK #4 are provided to the BIT device. Accordingly, the digital signature BIT device includes a clock multiplexer circuit 48.

The clock multiplexer circuit 48 is provided with a plurality of clock signals and is electrically coupled to the control data receiving and processing circuit 8 (more specifically, the control circuit 38). The control circuit 38 provides a clock select signal to the clock multiplexer circuit 48. The clock multiplexer circuit selects one of the clock signals in response to the clock select signal, and provides a selected clock signal to the LFSR circuit 30 and the second counter circuit 42.

A clock buffer circuit 50 may further be included. The clock buffer circuit 50 is interposed between the clock multiplexer circuit 48 and the LFSR circuit 30 and the second counter circuit 42. The clock buffer circuit is responsive to the selected clock signal from the clock multiplexer circuit 48, and provides a buffered selected clock signal to the LFSR circuit 30 and the second counter circuit 42. The LFSR and second counter circuits operate at the buffered selected clock signal rate. The clock buffer circuit 50 is enabled and disabled with the start/stop signal provided by the start/stop latch circuit 44.

In another preferred form of the invention, the digital signature BIT device may operate in conjunction with other digital signature BIT devices by receiving test data serially and providing signature data serially.

More specifically, and as mentioned previously with respect to FIG. 2 of the drawings, the first three input exclusive OR gate 20d of the first LFSR 12 includes one input on which is provided serial data. The Q output of the last register 18i in the third LFSR 16 is connected to the serial data output of the digital signature bit device. Accordingly, the signature data word may be read out in parallel on the 8 bit data bus, or serially on the serial data output, and the input of the first LFSR 12 may be provided with test data serially.

In order for the digital signature BIT device to be more universally applicable, the device includes a plurality of serial data inputs SDI #1 - SDI #4 for receiving serial data, and a serial data input multiplexer circuit 52 electrically coupled to the serial data inputs, as well as to the control circuit 38 of the control data receiving and processing circuit 8. The control circuit 38 provides a serial data input select signal to the serial data input multiplexer circuit 52. The serial data input multiplexer circuit 38 is responsive to the serial data input select signal and selects one of the plurality of serial data provided to it, and provides the selected serial data to the LFSR circuit 30.

The control circuit 38 receives and processes various control data and signals provided to it by the remote processor. For example, the control circuit 38 receives a read/write (R/W*) signal. This signal controls the direction of the data bus between the BIT device and the host computer 10. When the R/W* signal is a "0", the data direction is into the BIT device for writing control data into latches of the control circuit 38. When the signal is a "1", the direction is out of the BIT device for reading the signature or "status" word.

When the control circuit 38 receives a reset signal, it provides a reset signal to the LFSR circuit 30 and to the first counter circuit 36 to reset each of the circuits.

A device select (DEVICE SEL*) signal into the control circuit 38 provides a unique address code to the BIT device and enables writing control data into or reading data out of the device.

When the control circuit receives a data strobe (DATA STR*) signal, it will provide a strobe to the clock input of the first counter 36 in order for the signature data word to be read from the buffer memory circuit 32 by the remote processor 10. This signal also writes data into data latches of the control circuit 38, and a high-to-low logic transition is used to latch the data.

The control circuit also provides a disable input signal to the LFSR circuit 30, which disables the first NAND gates 22 of the LFSR circuitry (See FIG. 3), a preset signal, which is provided to the preset on the individual registers 18 of the first, second and third LFSRs 12–16 in order to preset each of these registers, and a mode signal, which is provided to the second NAND gates 24 of the LFSR circuitry (See FIG. 3) to put the LFSR circuitry in a serial mode or a parallel signature mode.

Figure 5:
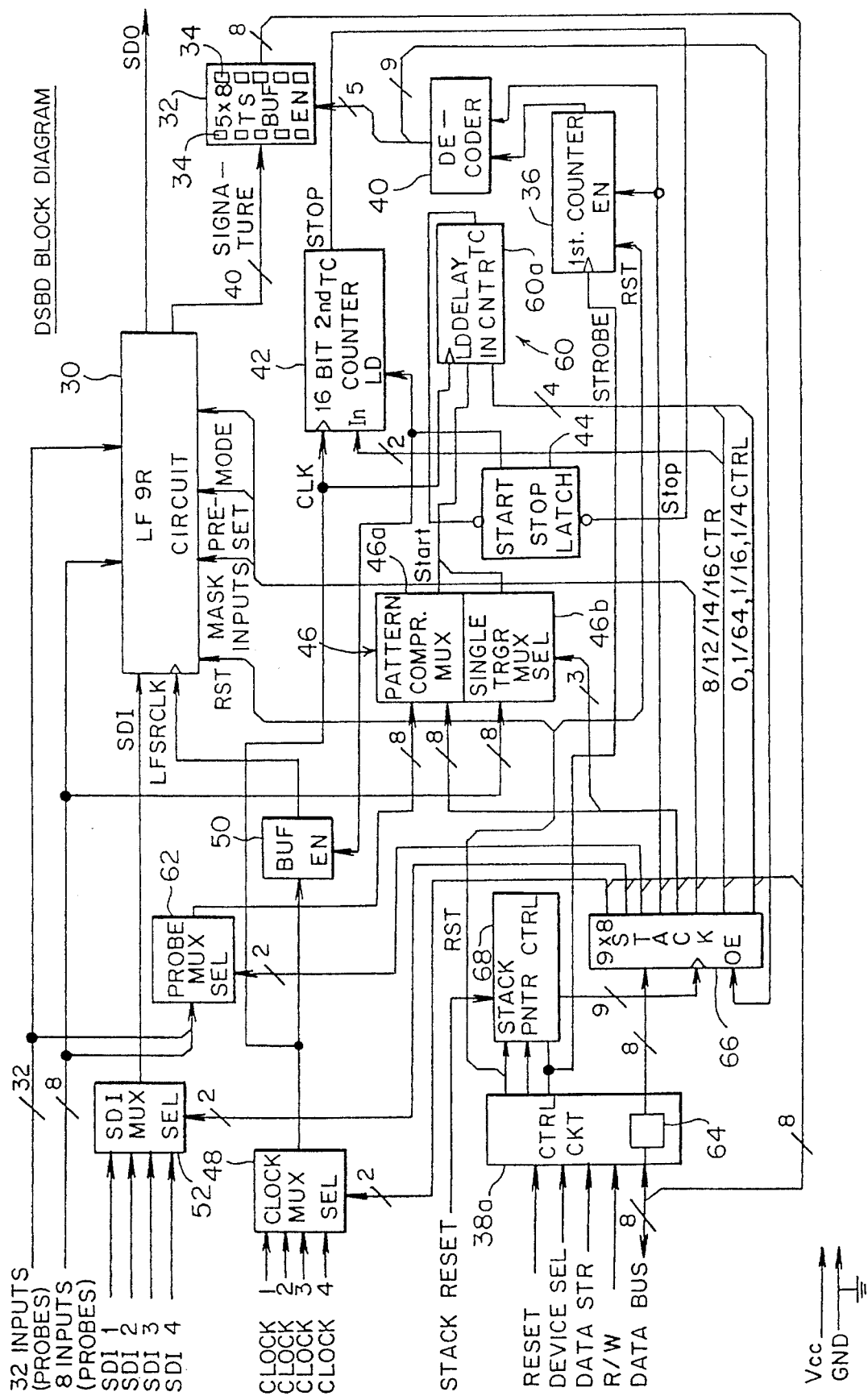
FIG. 5 is a more detailed block diagram of a digital signature BIT device formed in accordance with another form of the present invention.

Another form of the digital signature BIT device of the present invention is illustrated by FIG. 5 of the drawings. This device is similar in many respects to the device illustrated by FIG. 4 and described previously. All of the basic elements described previously remain basically unchanged, except as described below.

The enabling circuit 4 which allows the LFSR circuitry 30 to operate for a predetermined period of time includes a start delay circuit 60. The start delay circuit 60 is electrically coupled to the start/stop latch circuit 44 and to the start signal multiplexer and comparator circuit 46. The start delay circuit 60 receives the start signal from the start signal multiplexer and comparator circuit 46, and provides a delayed start signal in response to the start signal. The delayed start signal is provided to the start/stop latch circuit 44, which provides the start/stop signal in response to the delayed start signal.

In one form of the invention, the start delay circuit 60 is basically a delay counter 60a for enabling a programmable delay at the start of a test. There are four delay periods provided and which are fractions of the selected test period—0, $1/64$, $1/16$ and $1/4$. The delay counter 60a is programmed with one of the four delay periods by providing the counter with a delay select signal from the control data receiving and processing circuitry 8.

The initial start signal received from the start signal multiplexer and comparator circuit 46, depending on the mode selection, will start the delay counter 60a and, after the delay period has run, the delay counter will provide a terminal count or delayed start signal to the start/stop latch 44 which, in turn, will enable the second counter circuit 42 to run for the respective test period.

Additionally, the digital signature BIT device shown in FIG. 5 may include a probe multiplexer circuit 62. The probe multiplexer circuit 62 is connected to the 40 test data inputs and, in response to a probe multiplexer select signal provided to it by the control data receiving and processing circuitry 8, will select one of four or five groups of 8 bits of test data to compare with the start data provided by the control data receiving and processing circuitry.

The start signal multiplexer and comparator circuit 46 in this embodiment basically includes two sections—a pattern comparator and multiplexer circuit 46a and a single trigger comparator and multiplexer circuit 46b.

As its name implies, the pattern comparator and multiplexer circuit 46a will compare one or more bits of the 8 bit test data group selected by the probe multiplexer circuit 62 with an equal number of bits of start data provided by the control data receiving and processing circuit 8. When the test data and start data are equal, the start signal multiplexer and comparator circuit 46 will provide the start signal.

The single trigger comparator and multiplexer circuit 46b will select one of eight test data bits provided to it and one of eight start data bits also provided to it, in accordance with the select signal from the control data receiving and processing circuitry 8, and will compare the two data bits and provide the start signal if the two bits are equal.

The control data receiving and processing circuitry 8 shown in the embodiment of FIG. 5 includes a control circuit 38a having a buffer register 64 which receives at least some of the control data provided to the digital signature BIT device on the data bus and which stores this data in the buffer register 64. The control circuit 38a provides one or more control signals in response to the control data it receives from the remote processor 10.

The control data receiving and processing circuitry 8 further includes a stack register 66 which is electrically coupled to the control circuit 38a. The stack register 66 receives the control data stored in the buffer register 64 and stores the data in the stack register. The stack register 66 has one or more outputs.

The control data receiving and processing circuitry 8 further includes a stack pointer control circuit 68 which is electrically coupled to the control circuit 38a and to the stack register 66. The stack pointer control circuit 68 provides a stack pointer signal in response to a control signal from the control circuit. The stack register 66 is responsive to the stack pointer signal and provides control data on the stack register outputs in response to the stack pointer signal.

The overall function of the control data receiving and processing circuit 8 is to interface with the host system via the 8 bit data bus. It receives in its registers the control parameters from the host computer 10 to set up the serial data input selection multiplexer circuit 52, the clock multiplexer circuit 48, the start signal multiplexer and comparator circuit 46 and configure the test period timing counter 42 and the delay counter 60a, as well as program the LFSR circuitry 30. The control circuit also provides status data back to the remote processor 10. The 40 bit signature data word is read back through the input/output buffer registers 64 of the control circuit 38a in five 8 bit bytes.

The digital signature BIT device of the present invention can operate in three basic modes: signature matching; activity monitoring; and a "snapshot" mode.

In the signature matching mode, the digital signature BIT device will provide a signature data word of the test data of the digital circuit over a predetermined period of time, as described previously. This signature data word will be compared by the remote processor 10 to what is expected. A fault is detected if the signature data word does not conform to the word which is expected.

In the activity monitoring mode, the LFSRs 12–16 may be disabled (by the mode and disable signals applied to NAND gates 22, 24 of the LFSRs) so that the shifting of input test data in the LFSRs will be disabled. The digital signature BIT device will monitor the activity on the forty test inputs. The edges of the input test data are captured by the flip flops 18 and differentiated by the exclusive OR gates 20 to produce pulses. These pulses will set the LFSR circuitry. A signature data word can be read back to the remote processor 10 and all the test data inputs having activity will provide a logic "1" in the corresponding bit of the signature data word as status.

In the "snapshot" mode, a transition in the logic state of one of the test data inputs will cause the digital signature BIT device to clock in to the LFSR circuitry 30 the state of each of the test data on all of the inputs at that transition. This data is read out as a signature data word.

The three basic modes described above can be subdivided into six "submodes" in which the BIT device operates: an LFSR single trigger mode; LFSR pattern trigger mode; edge detector mode; edge detector self-test mode; single clock latch mode; and LFSR self-test mode.

In the LFSR pattern trigger and edge detector modes, a selected group of 8 inputs (probes) are compared against an 8 bit test pattern word, as described previously. A masking function is provided where any number of the 8 inputs can be disabled for the pattern trigger. Any combination of one to eight of the selected inputs can be matched.

The three most significant bits of the test pattern word will select one of 8 inputs when in the LFSR single trigger mode.

For the single clock latch mode, the pattern trigger function is utilized to start the test. At the start of the test, a single clock is allowed to the LFSR circuit and all remaining clocks to the LFSR are disabled. The 40 inputs (probes) are latched into the LFSR circuit, producing input (probe) status.

For the edge detector self-test mode, a pulse is created and routed to each flip flop of the LFSR. This will provide pulses to the LFSR circuit to latch activity. In the edge detector self-test mode, a signal is generated to set activity for all 40 inputs (probes).

For the LFSR self-test mode, the digital signature BIT device is configured to preset the LFSR circuit. One serial data input is selected and all data inputs will be disabled. After a predetermined period of time after the test is started, a signature is captured in the LFSR circuit and compared by the remote processor with what is expected.

In the edge detector mode, the LFSR circuit will disable the shifting of input data and monitor activity on the 40 test data inputs (probes). The edges of the inputs are captured by the flip flops of the LFSR, and differentiated by the exclusive OR gates to produce pulses. These pulses will set the LFSR circuit. A signature can be read back and all the inputs with activity will provide a "1" in corresponding bits of a status word.

FIG. 6 shows a preferred form of the control data word format. The digital signature BIT device receives nine control data words on the data bus from the remote processor 10. The nine data words are described in Table I below.

TABLE I

DATA WORD 0

| | | |
|---|---|---|
| Bit 1 - | PRST: | This Bit when set to "1" presets the LFSR to a predetermined non-zero state. When set to "0", it will clear the LFSR. This Bit is latched. |
| Bit 2 - | RD SIG: | This Bit when in the "0" state enables the reading of the nine, eight Bit input data words. When this Bit is set to a "1", the five, eight Bit signature status words are enabled for being read along with the nine input data words. This Bit is latched. |
| Bits 3–5 - | MODE: | These three Bits allow the selection of one of the six modes of operation. These Bits are latched and decoded as follows: |

| BIT 5 4 3 | MODE |
|---|---|
| 0 0 0 | LFSR Single Trigger |
| 0 0 1 | LFSR Pattern Trigger |
| 0 1 0 | EDGE Detector |
| 0 1 1 | EDGE Detector Self-Test |
| 1 0 0 | Single Clock Latch |
| 1 0 1 | LFSR Self-Test |
| 1 1 0 | Invalid |
| 1 1 1 | Invalid |

| | | |
|---|---|---|
| Bits 6 & 7 - | PRB SEL: | These two Bits allow the selection of one of four groups of eight inputs (probes) which are steered to the start signal multiplexer and comparator circuitry 46. These Bits are latched and decoded as follows: |

TABLE I-continued

| BIT 7 6 | SELECTED INPUTS (PROBES) |
|---|---|
| 0 0 | Inputs (PROBES) 1–8 |
| 0 1 | Inputs (PROBES) 9–16 |
| 1 0 | Inputs (PROBE) 17–24 |
| 1 1 | Inputs (PROBES) 25–32 |

DATA WORD 1

Bits 0 & 1 - SDI SEL: These two Bits allow the selection of one Serial Data Input (SDI) out of the four SDIs. These Bits are latched. The SDI selection is as follows:

| BIT 1 0 | SDI SELECTION |
|---|---|
| 0 0 | SDI # 1 |
| 0 1 | SDI # 2 |
| 1 0 | SDI # 3 |
| 1 1 | SDI # 4 |

Bits 2 & 3 - CLK SEL: - These two Bits allow the selection of one of the four clock inputs. These Bits are latched. The clock selection is as follows:

| BIT 2 & 3 | CLK SELECTION |
|---|---|
| 0 0 | CLK # 1 |
| 0 1 | CLK # 2 |
| 1 0 | CLK # 3 |
| 1 1 | CLK # 4 |

Bits 4 & 5 - PERIOD SEL: These two Bits allow selection of one of the four test duration time. These Bits are latched. The test duration time selection is as follows:

| BIT 5 4 | TEST DURATION |
|---|---|
| 0 0 | 256 Clocks |
| 0 1 | 4096 Clocks |
| 1 0 | 16384 Clocks |
| 1 1 | 65536 Clocks |

Bits 6 & 7 - DLY SEL: These two Bits allow the selection of a delay period at the start of a test. The delay period will be a fraction of the selected test period. These Bits are latched and are decoded as follows:

| BIT 7 6 | DELAY PERIOD |
|---|---|
| 0 0 | 0 |
| 0 1 | 1/64 |
| 1 0 | 1/16 |
| 1 1 | 1/4 |

DATA WORD 2

Bits 0–7  START TEST PATTERN MASK: These eight Bits provide a mask for a start test pattern. When any of the Bits are set to "0", a match is forced on the respective test pattern Bits, therefore, by passing the input (probe) match condition. When any of the Bits are set to "1", a match condition can only occur between the respective inputs (probes) and the test pattern. These Bits are latched.

DATA WORD 3

Bits 0–7  START TEST PATTERN/START SIGNAL SELECT: These eight Bits provide a start test pattern when in the pattern trigger, edge detector and single clock latch modes. This pattern is compared with a group of eight inputs (probes) and when a match occurs in the respective modes, preceded by a word 8 transfer, the test will begin.

In addition, when the mode of operation is single trigger, the three MSB's (Bits 5–7) provide the selection of one of the eight inputs (probes) to initiate the test. These Bits are latched. The selection of inputs is as follows:

| BITS 7 6 5 | INPUT SELECTION |
|---|---|
| 0 0 0 | INPUT 1 |
| 0 0 1 | INPUT 2 |
| 0 1 0 | INPUT 3 |
| 0 1 1 | INPUT 4 |
| 1 0 0 | INPUT 5 |
| 1 0 1 | INPUT 6 |
| 1 1 0 | INPUT 7 |
| 1 1 1 | INPUT 8 |

DATA WORDS 4–8

Bits 0–7  INPUT PROBE MASK: These five eight Bit data words comprise a 40 Bit input (probe) mask. When set to a "1", the respective inputs (probes) are enabled to the LFSR circuitry. When set to a "0" the respective inputs (probes) are disabled from the LFSR circuitry.

The format of the output data or status words from the digital signature BIT device is shown in FIG. 7 and described below.

There are fourteen status words that can be read back from the BIT device. The first nine status words are the nine input data words described in Table I which are in latches of the BIT device. If Bit 2 (RD SIG) in data word 0 is set to "0" the first nine status words will be available on the data bus starting with status word 0. The first counter 36 is advanced by the trailing edge of DEVICE SEL and each status word is brought out on the data bus in sequence to be read by the processor. As long as the RD SIG is set at "0" the counter loops around sequence 0, 1, 2, 3, 4, 5, 6, 7, 8.

BIT 0 in status word 0, when "1" indicates that the test is complete. The five signature status words can be read along with the nine input data words by setting RD SIG to "1". Starting with status word 9, all of the five signature status words will be available on the data bus in sequence. As long as RD SIG is set to "1" the counter will loop around sequence 0, 1 . . . 8, 9, 10, 11, 12, 13, 14.

As can be seen from the above description, the digital signature BIT device of the present invention is universally adaptable to test a variety of digital circuits. The use of the LFSR circuitry to compress the test data allows a relatively large number of test data inputs to be monitored over a relatively long predetermined period of time. The digital signature BIT device of the present invention can function in various modes, and operates substantially independently of the remote processor. Only an 8 bit data bus and five additional control lines are provided between the digital signature BIT device and the remote processor.

The digital signature BIT device occupies relatively little real estate on the digital circuit, and provides fault detection with a high degree of accuracy.

Although illustrative embodiments of the present invention have been described herein with reference to the accompanying drawings, it is to be understood that the invention is not limited to those precise embodiments, and that various other changes and modifications may be effected therein by one skilled in the art without departing from the scope or spirit of the invention.

What is claimed is:

1. A digital signature built-in-test device for testing a digital circuit, which comprises:

means for compressing test data received from the digital circuit being tested, the test data compressing means providing a signature data word corresponding to the test data received, the test data compressing means including a cascaded arrangement of a first linear feedback shift register, a second linear feedback shift register electrically coupled in series to the first linear feedback shift register, and a third linear feedback shift register electrically coupled in series to the second linear feedback shift register, each of the first, second and third linear feedback shift registers having a plurality of test data inputs which are electrically coupled to the digital test circuit and on which are provided the test data;

means for enabling the test data compressing means for a predetermined period of time, the enabling means providing an enable signal to the test data compressing means;

means for storing the signature data word from the test data compressing means; and means for receiving and processing control data from a remote processor, the control data receiving and processing means providing control signals to the test data compressing means, signature data word storing means and enabling means;

wherein each of the first, second and third linear feedback shift registers includes a plurality of serially interconnected stages, each of the test data inputs of a respective linear feedback shift register being coupled to a respective one of the stages; and wherein the first linear feedback shift register includes fewer stages than the second linear feedback shift register, and the second linear feedback shift register includes fewer stages than the third linear feedback shift register.

2. A digital signature BIT device for testing a digital circuit, which comprises:

means for compressing test data received from the digital circuit being tested, the test data compressing means providing a signature data word corresponding to the test data received;

means for enabling the test data compressing means for a predetermined period of time, the enabling means providing an enable signal to the test data compressing means;

means for storing the signature data word from the test data compressing means; and means for receiving and processing control data from a remote processor, the control data receiving and processing means providing control signals to the test data compressing means, signature data word storing means and enabling means;

wherein the enabling means includes:

a counter circuit;

a start/stop latch circuit, the start/stop latch circuit being electrically coupled to the counter circuit and providing a start/stop signal, the counter circuit being enabled to count in response thereto and providing a terminal count signal after counting a predetermined number of counts; and a start signal multiplexer and comparator circuit, the start signal multiplexer and comparator circuit being electrically coupled to the start/stop latch circuit and to the control data receiving and processing means, the control data receiving and processing means providing start data and a select signal to the start signal multiplexer and comparator circuit, the start signal multiplexer and comparator circuit being further provided with test data from the digital circuit, the start signal multiplexer and comparator circuit selecting at least one of the test data in response to the select signal and comparing the selected test data and the start data and providing a start signal in response to the comparison thereof, the start/stop latch circuit providing the start/stop signal in response to the start signal.

3. A digital signature built-in-test device as defined by claim 2, wherein the enabling means further includes:

a start delay circuit, the start delay circuit being electrically coupled to the start/stop latch circuit and to the start signal multiplexer and comparator circuit, the start delay circuit providing a delayed start signal in response to the start signal, the start/stop latch circuit providing the start/stop signal in response to the delayed start signal.

4. A digital signature built-in-test device for testing a digital circuit, which comprises:

means for compressing test data received from the digital circuit being tested, the test data compressing means providing a signature data word corresponding thereto;

means for enabling the test data compressing means for a predetermined period of time, the enabling means providing an enable signal to the test data compressing means;

means for storing the signature data word from the test data compressing means;

means for receiving and processing control data from a remote processor, the control data receiving and processing means providing control signals to the test data compressing means, signature data word storing means and enabling means; and a clock multiplexer circuit, the clock multiplexer circuit being provided with a plurality of clock signals and being electrically coupled to the control data receiving and processing means, the control data receiving and processing means providing a clock select signal, the clock multiplexer circuit selecting one of the clock signals in response to the clock select signal and providing a selected clock signal, the test data compressing means being responsive to the selected clock signal.

5. A digital signature built-in-test device as defined by claim 4, wherein the clock multiplexer circuit further includes a clock buffer circuit, the clock buffer circuit being responsive to the selected clock signal and providing a buffered selected clock signal, the test data compressing means being responsive to the buffered selected clock signal.

6. A digital signature built-in-test device for testing a digital circuit, which comprises:

means for compressing test data received from the digital circuit being tested, the test data compressing means providing a signature data word corresponding to the test data received;

means for enabling the test data compressing means for a predetermined period of time, the enabling means providing an enable signal to the test data compressing means;

means for storing the signature data word from the test data compressing means;

means for receiving and processing control data from a remote processor, the control data receiving and processing means providing control signals to the test data compressing means, signature data word storing means and enabling means; and a plurality of serial data inputs for receiving serial data, and a serial data input multiplexer circuit, the serial data input multiplexer circuit being electrically coupled to the serial data inputs and to the control data receiving and processing means, the control data receiving and processing means providing a serial data input select signal, the serial data input multiplexer circuit being responsive to the serial data input select signal and selecting one of the plurality of serial data and providing selected serial data corresponding thereto, the test data compressing means being responsive to the selected serial data and providing a signature data word corresponding thereto.

7. A digital signature built-in-test device for testing a digital circuit, which comprises:

means for compressing test data received from the digital circuit being tested, the test data compressing means providing a signature data word corresponding to the test data received, the test data compressing means including a cascaded arrangement of at least first and second linear feedback shift registers, the first linear feedback shift register being electrically coupled in series to the second linear feedback shift register, each of the at least first and second linear feedback shift registers having a plurality of test data inputs which are electrically coupled to the digital test circuit and on which are provided the test data;

means for enabling the test data compressing means for a predetermined period of time, the enabling means providing an enable signal to the test data compressing means;

means for storing the signature data word from the test data compressing means; and means for receiving and processing control data from a remote processor, the control data receiving and processing means providing control signals to the test data compressing means, signature data word storing means and enabling means;

wherein each of the at least first and second linear feedback shift registers includes a plurality of serially interconnected stages, each of the test data inputs of a respective linear feedback shift register being coupled to a respective one of the stages; and wherein the first linear feedback shift register includes fewer stages than the second linear feedback shift register.

* * * * *